United States Patent

Son

[11] Patent Number: 5,923,057
[45] Date of Patent: Jul. 13, 1999

[54] BIPOLAR SEMICONDUCTOR DEVICE AND METHOD FOR FABRICATING THE SAME

[75] Inventor: Jeong-Hwan Son, Daejeon-si, Rep. of Korea

[73] Assignee: LG Semicon Co., Ltd., Chungcheongbuk-do, Rep. of Korea

[21] Appl. No.: 08/802,819

[22] Filed: Feb. 19, 1997

[30] Foreign Application Priority Data

May 2, 1996 [KR] Rep. of Korea .................... 96-14162

[51] Int. Cl.⁶ ............................................. H01L 31/0328
[52] U.S. Cl. .................... 257/197; 257/584; 257/586; 257/587
[58] Field of Search .................... 257/197, 587, 257/586, 584, 575

[56] References Cited

U.S. PATENT DOCUMENTS

| | | | |
|---|---|---|---|
| 4,483,726 | 11/1984 | Issac et al. | 257/587 |
| 4,775,882 | 10/1988 | Miller et al. | 357/35 |
| 4,896,203 | 1/1990 | Kajikawa | 257/197 |
| 5,266,818 | 11/1993 | Tsuda et al. | 257/197 |
| 5,332,912 | 7/1994 | Nozu et al. | 257/197 |
| 5,374,846 | 12/1994 | Takemura | 257/587 |
| 5,412,233 | 5/1995 | Dubon-Chevallier et al. | 257/197 |
| 5,629,556 | 5/1997 | Johnson | 257/587 |
| 5,648,666 | 7/1997 | Tran et al. | 257/197 |

OTHER PUBLICATIONS

Internatinal Electron Devices meeting, *The Technical Digest*, Dec. 13–16, 1992; pp. 4.4.1–4.4.4.

*Primary Examiner*—David B. Hardy
*Assistant Examiner*—Huy Bui

[57] ABSTRACT

A method for fabricating a bipolar device, including the steps of forming an epitaxial growth retarding layer on a substrate at a predetermined angle, forming a collector layer on the substrate so that the collector layer is adjacent the epitaxial growth retarding layer and has an inclined portion formed over an edge portion of the epitaxial growth retarding layer, forming a base layer having an inclined portion on the collector layer, and forming an emitter layer on the inclined portion of the base layer.

27 Claims, 3 Drawing Sheets

BIPOLAR SEMICONDUCTOR DEVICE AND METHOD FOR FABRICATING THE SAME

BACKGROUND OF THE INVENTION

The present invention relates to a semiconductor device and a method for fabricating the same, and more particularly, to a bipolar transistor and a method for fabricating the same.

FIG. 1 shows a cross-sectional view of a heterojunction bipolar transistor formed using a compound semiconductor. Its fabrication process will be explained below.

First of all, an n+ GaAs subcollector layer 12, n− GaAs collector layer 13, p+ GaAs base layer 14, n− GaAs emitter layer 15, and n+ GaAs emitter cap layer 16 are sequentially grown on a GaAs substrate 11 through epitaxy. Then, a metal is deposited thereon and patterned to form an emitter electrode 17. The emitter cap layer 16 and the emitter layer 15 are patterned to form an emitter portion.

Thereafter, a metal is deposited on the exposed base layer 14 to form a base electrode 18 and the base layer 14 is patterned to form a base portion. At the same time, the collector layer 13 is etched. Then a metal is deposited on the exposed subcollector layer 12 and patterned to form a collector electrode 19. The subcollector layer 12 is etched to form a collector portion.

For increasing the operation speed of the semiconductor device, it is required that the base layer be thin and the emitter area be small. However, in the aforementioned conventional method, a narrow space is formed between the emitter electrode 17 and base electrode 18 and a thin base layer is formed. Thus, the base layer may be easily damaged during etching of the emitter layer. This makes the fabrication process difficult.

In order to solve the above problem, a technique using selective epitaxy has been proposed. This technique will be explained below with reference to FIG. 2.

As shown in FIG. 2, a subcollector layer 12, a collector layer 13 and a base layer 14 are sequentially formed on a substrate 11 through epitaxy. An epitaxy mask is formed of $Si_3N_4$ on the portion where a base is to be formed, and then the epitaxy is carried out. Accordingly, a selective epitaxy is accomplished to thereby grow an emitter layer 15 and an emitter cap layer 16 on the portion where the epitaxy mask ($Si_3N_4$) is not formed. That is, the emitter layer 15 and emitter cap layer 16 are not grown on the epitaxy mask. Here, the emitter layer 15 and emitter cap layer 16 are formed in the shape of an overhang around the epitaxy mask as shown in FIG. 2.

Thereafter, the epitaxy mask is etched, and a metal layer is deposited thereon. By doing so, an emitter electrode 17 and a base electrode 18 are simultaneously formed using the overhang. Then, the portion of the metal layer formed where the base electrode 18 is not formed is etched through photolithography. The base layer 14 and collector layer 13 are also selectively etched through photolithography. Then a collector electrode 19 is formed on the exposed subcollector layer 12.

According to this technique, the emitter electrode 17 and base electrode 18 are simultaneously formed, and the collector electrode 19 is formed on the exposed subcollector layer 12. If the emitter electrode 17 and base electrode 18 cannot be formed using the same metal material, the emitter electrode 17 is formed first before the epitaxy mask is etched. Then the epitaxy mask is etched and the base electrode 18 is formed by depositing a metal on portions of the base layer 14.

In the aforementioned method for fabricating the bipolar transistor as shown in FIG. 2, which attempts to solve the problems of the device shown in FIG. 1, the base layer 14 is grown by a first selective epitaxy, and the emitter layer 15 and emitter cap layer 16 are grown by a second selective epitaxy using a $Si_3N_4$ layer as an epitaxy mask. This technique has the following advantages. Only the $Si_3N_4$ mask layer is removed in order to form the base electrode 18, and the emitter electrode 17 and base electrode 18 can be simultaneously formed using the overhang of the emitter layer 15.

In the aforementioned technique, however, the emitter-base junction, which is an important portion of the bipolar transistor, is exposed during the fabrication process, which results in a deterioration of junction characteristics. Also, two-time epitaxy must be carried out complicating the fabrication process. Furthermore, although the surface area of the emitter layer 16 can be decreased, the surface area of the emitter electrode 17 and emitter layer 16 becomes identical. Thus, if the surface area of the emitter layer 16 is small, the surface area of the emitter electrode 17 becomes small, which makes it difficult to connect the emitter electrode 17 to a pad, or to another electrode.

SUMMARY OF THE INVENTION

It is an object of the present invention to provide a bipolar transistor and a method for fabricating the same to overcome the above and other problems of the conventional bipolar device and method, whereby a hetero-junction bipolar transistor having a small emitter area and a thin base layer is fabricated through selective epitaxy, for increasing operation speed of the transistor.

To accomplish the above and other objects of the present invention, there is provided a bipolar device including an insulating layer formed on a substrate; a collector formed on the substrate, the collector being adjacent the insulating layer, the collector having an inclined portion where the collector contacts the insulating layer; a base formed on the inclined portion of the collector and a portion of the collector; and an emitter formed on the base corresponding to the inclined portion of the collector.

Here, the collector is thicker than the insulating layer, whereas the base is thinly formed on the inclined portion of the collector and thickly formed on a portion of the collector. The bipolar device further includes an emitter electrode formed on the emitter and the insulating layer, a base electrode formed on the thick portion of the base, and a collector electrode formed on a portion of the collector where the base is not formed.

It is preferable that the substrate is formed of one of GaAs, InP, gap and Si.

For achieving the objects of the present invention, there is further provided a method for fabricating a bipolar device, including the steps of forming an epitaxial growth retarding layer on a substrate, the layer being angled to the orientation of the substrate by a predetermined angle; forming a collector layer on the substrate, the collector layer being adjacent to the retarding layer, the collector layer having an inclined portion and its top extending from the inclined portion; forming a base layer on the collector layer, the base layer being formed thinner on the inclined portion of the collector layer than on the top of the collector layer; and forming an emitter layer on the base layer.

The present method further includes the steps of depositing and patterning a conductive material on the retarding layer and base layer to form an emitter electrode; selectively etching the emitter layer to form an emitter and, at the same time, exposing the base layer; depositing and patterning a conductive material on the base layer to form a base electrode; and selectively etching the base layer to form a base, selectively etching a portion of the collector, and depositing and patterning a conductive material on the conductive layer to form a collector electrode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Briefly described, the present invention is directed to a bipolar device including an insulating layer formed on a substrate, a collector formed on the substrate and having an inclined portion, a base formed on the collector and having an inclined portion, and an emitter formed on the inclined portion of the base and having an inclined portion.

Furthermore, the present invention is directed to a method for fabricating a bipolar device, including the steps of forming an insulating layer on a substrate, forming a collector having an inclined portion on the substrate, forming a base having an inclined portion on the collector, and forming an emitter on the inclined portion of the base so that the emitter has an inclined portion.

BRIEF DESCRIPTION OF THE DRAWINGS

The novel features believed characteristic of the invention, as well as other features and advantages thereof, will best be understood by reference to the following detailed description of a preferred embodiment, read in conjunction with the accompanying drawings illustrative of examples thereof, wherein.

DETAILED DESCRIPTION OF PREFERRED EMBODIMENTS

A preferred embodiment of the present invention will be explained below with reference to the accompanying drawings.

Figure 1:
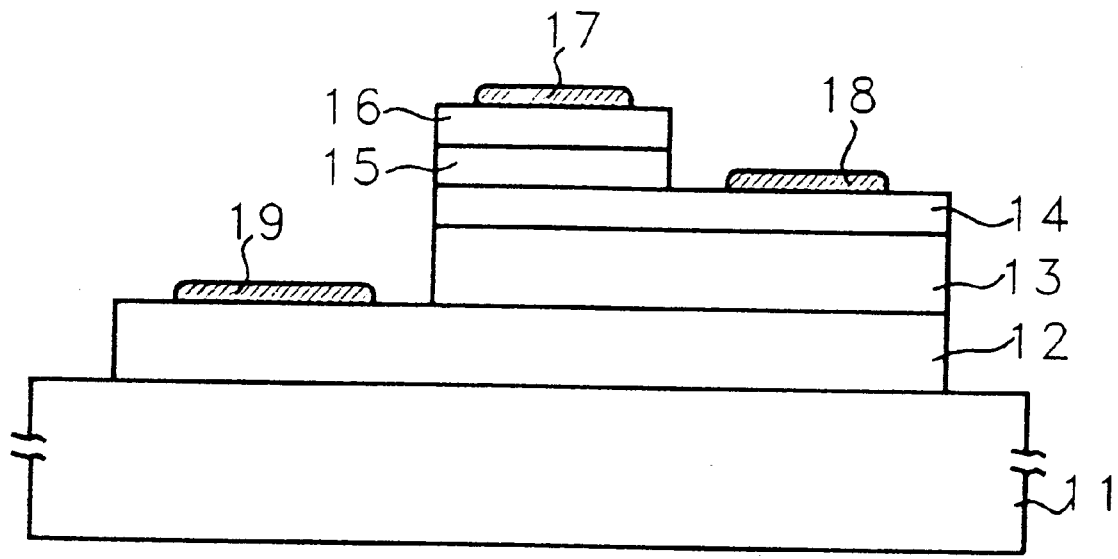
FIG. 1 is a cross-sectional view of a conventional bipolar device.
Figure 2:
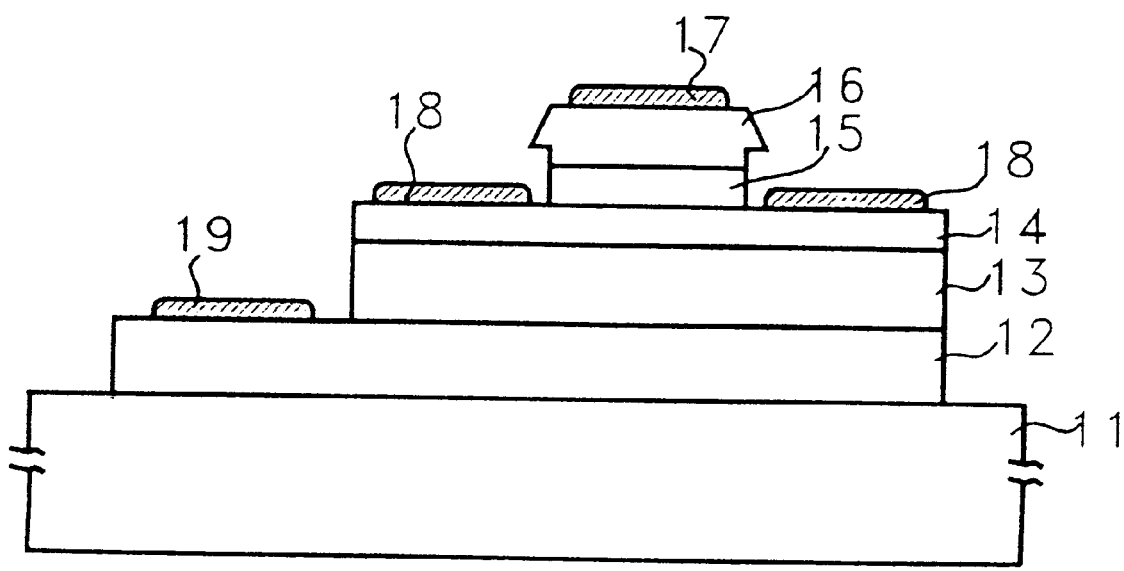
FIG. 2 is a cross-sectional view of another conventional bipolar device.
Figure 3:
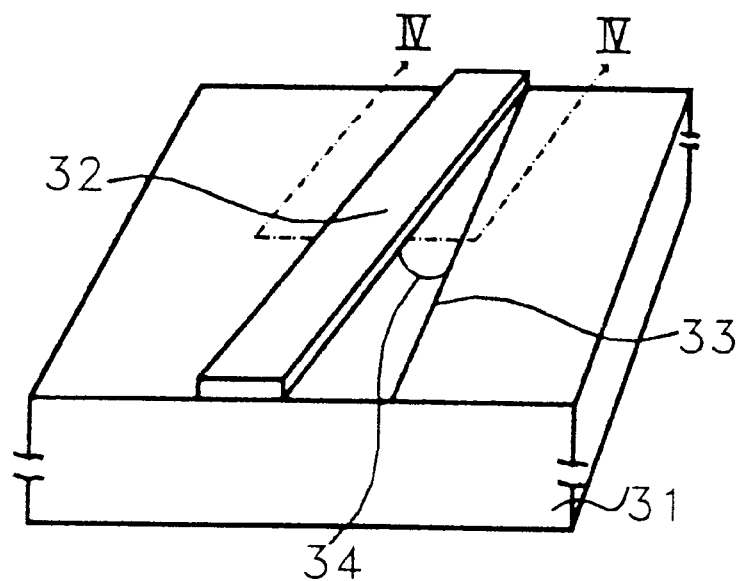
FIG. 3 is a perspective view for explaining the formation of an epitaxial growth retarding layer in the present invention.

A bipolar device according to the embodiments of the present invention is formed in a manner similar to the ways an epitaxy mask pattern 32 is formed in the shape of a strip on a (100) substrate 31, as shown in FIG. 3. The epitaxy mask pattern 32 is formed of a silicon oxide layer or silicon nitride layer. Here, the epitaxy mask pattern 32 is formed at a predetermined angle 34 with respect to orientation (110) or (1TO) 33 of the substrate 31. The angle 34 ranges, e.g., from 10° to 40°. According to this technique, a different form of an epitaxial layer can be grown after the selective epitaxy is performed. For example, when the epitaxy mask pattern 32 is formed at an angle of 10° to 40° with respect to the orientation (110) of the substrate 31, a horizontal growth form as shown in FIG. 4 is obtained.

Figure 4:
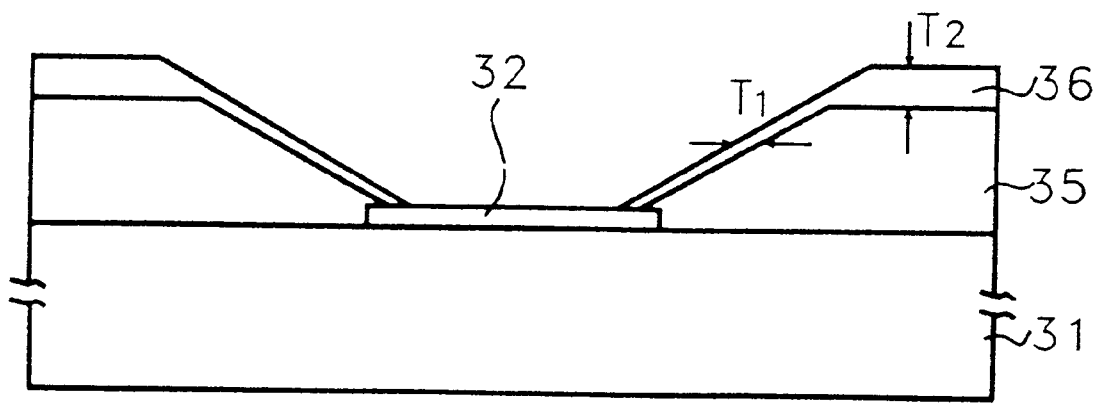
FIG. 4 is a cross-sectional view taken along line IV—IV of FIG. 3.

Referring to FIG. 4, when the epitaxial mask pattern 32 is formed on the substrate 31 at a predetermined angle and the epitaxial layers 35 and 36 are grown thereon, the growth is more horizontal than vertical. Accordingly, the epitaxial layers 35 and 36 have an inclined portion near and according to the epitaxy mask pattern 32. Thus, the growth thickness T1 of the inclined portion of the layer 36 becomes thinner than the growth thickness T2 of the horizontal portion of the same layer 36.

The bipolar semiconductor device of the present invention is formed using the above technique of the present invention.

Figure 5:
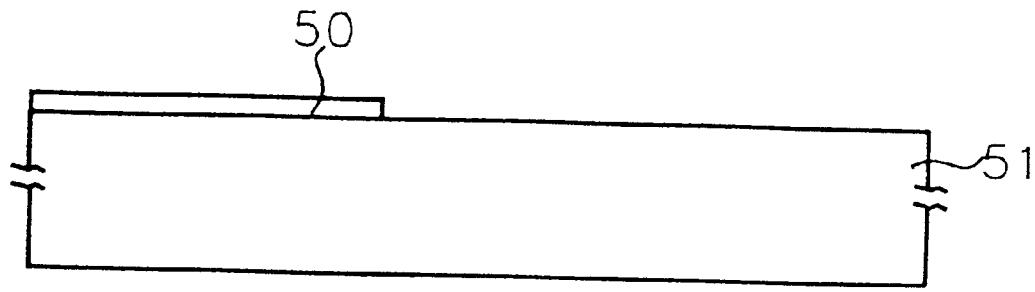
FIGS. 5, 6 and 7 are cross-sectional views for explaining a method of fabricating a bipolar device according to the embodiments of the present invention.
Figure 6:
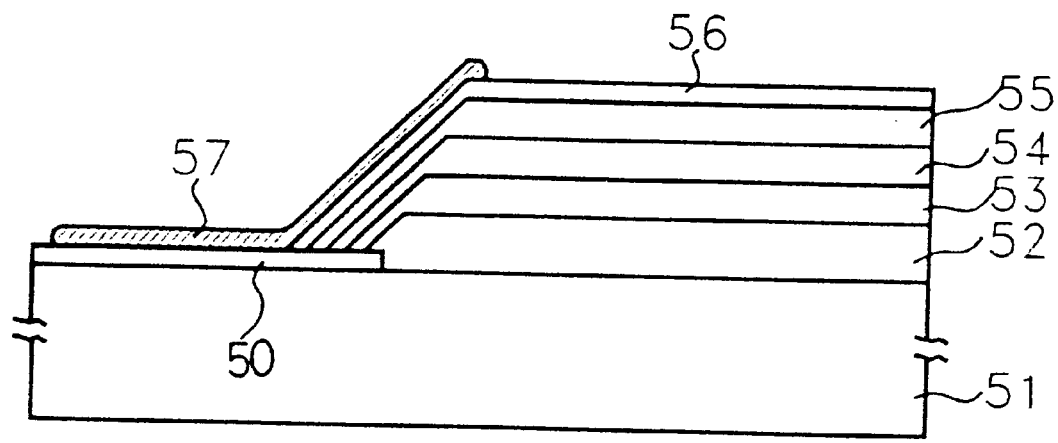
Figure 7:
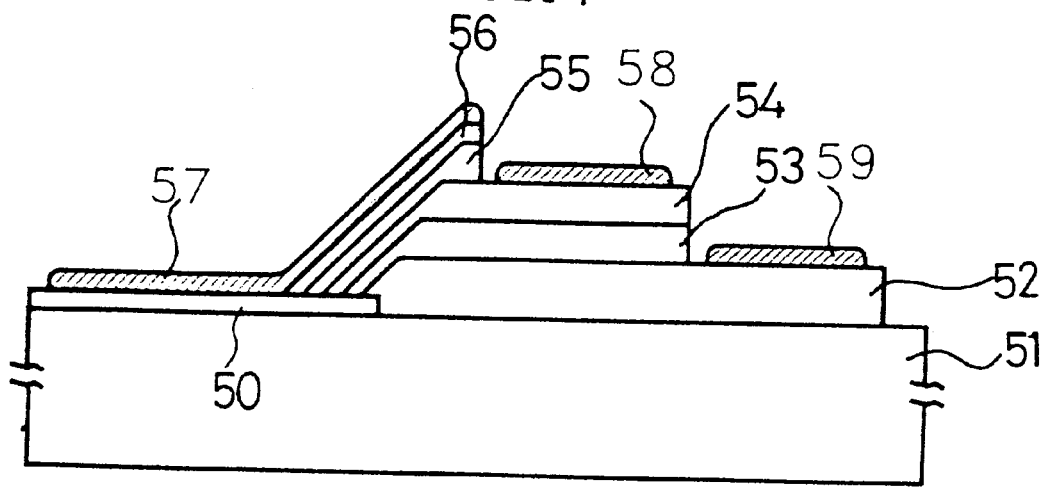

FIGS. 5, 6 and 7 are cross-sectional views showing a method for fabricating a bipolar semiconductor device according to the present invention. As shown in FIG. 5, an epitaxy mask 50 is formed at an angle on a semiconductor substrate 51 according to the above described technique. That is, the epitaxy mask So (growth retardation layer) in the shape of a strip is formed on the (100) substrate 51. The epitaxy mask 50 is formed of a silicon oxide layer or silicon nitride layer. The epitaxy mask 50 is formed at an angle, e.g., ranging from 10° to 40°, with respect to orientation (110) or (1TO) of the substrate 51. The substrate 51 is formed of one of GaAs, InP, GaP and Si.

As shown in FIG. 6, epitaxy is carried out to sequentially grow the layers for forming a bipolar transistor. For example, a subcollector layer 52, a collector layer 53, a base layer 54, an emitter layer 55 and an emitter cap layer 56 are sequentially grown on the substrate 51. Each of these layers has an inclined portion and a plane (horizontal) portion. As a result, the subcollector layer 52 and collector layer 53 are formed thickly on the portion of the substrate 51 where the epitaxy mask 50 is not formed, whereas the layers 52 and 53 are thinly formed in an inclined shape where the epitaxy mask 50 contacts the layers 52 and 53. Similarly, the base layer 54 is formed thinly on the inclined portion of the collector layer 53 and thick on the plane portion of the collector layer 53. The emitter layer 55 is formed thinly on the inclined portion of the base layer 54, and thick on the plane portion of the base layer 54.

Here, it is preferable that the substrate 51 is formed of GaAs, the subcollector layer 52 formed of n+ GaAs, the collector layer 53 formed of n− GaAs, the base layer 54 formed of p+ GaAs, the emitter layer 55 formed of n− GaAs, and the emitter cap layer 56 formed of n+ GaAs. As a result, an NPN type transistor is formed.

For forming a PNP type transistor, conductivity opposite to the ones used in the NPN type transistor is used. That is, the PNP transistor would include a substrate 51 formed of GaAs, a subcollector layer 52 formed of a p+ GaAs, a collector layer 53 formed of p− GaAs, a base layer 54 formed of n+ GaAs, and emitter layer 55 formed of p− GaAs, and an emitter cap layer 56 formed of p+ GaAs. In the present method, the epitaxy used is one of metal organic chemical vapor deposition (MOCVD), modular beam epitaxy (MBE), vapor phase epitaxy (VPE) and liquid phase epitaxy (LPE).

After performing the epitaxy to form the subcollector layer 52, the collector layer 53, the base layer 54, the emitter layer 55 and the emitter cap layer 56, a conductive material such as a metal is deposited thereon and patterned to form an emitter electrode 57 on the epitaxy mask 50 and on the inclined portion of the emitter cap layer 56. The emitter electrode 57 is formed using photolithography and covers the inclined portion and edge of the base layer 56. This enhances the fabrication process because if the emitter electrode 57 is formed only on the inclined portion of the base layer 56, the device characteristics may improve but the fabrication process will be complicated.

As shown in FIG. 7, portions of the emitter cap layer 56 and emitter layer 55 are then etched using the emitter electrode 57 as a mask to expose a portion of the base layer 54. Then a conductive material is deposited thereon and patterned to form a base electrode 58 adjacent the emitter electrode 57. Then portions of the base layer 54 and collector layer 53 are etched through photolithography to expose a portion of the subcollector layer 52. Then a conductive material is deposited thereon and patterned to form a collector electrode 59.

When the emitter cap layer 56 and emitter layer 55 are etched to expose the base layer 54, the emitter electrode 57 can be used as an etch mask. On the other hand, when the base layer 54 and collector layer 53 are etched, photolithography using a photoresist mask is used. But, the emitter cap layer 56 and emitter layer 55 can be etched also through photolithography.

When the bipolar transistor is fabricated by using the above-mentioned method, a base layer having a thin portion for directly engaging in the device operation and a thick portion on which the base electrode is formed, is formed. This facilitates the formation of the base electrode because its etching process can be easily controlled. Furthermore, it is possible to prevent the base electrode metal from being diffused to the collector layer. The portion of the base layer which engages in the actual operation of the device can be formed thin, reducing the time required for the carriers to pass the base layer. This increases the operation speed of the device.

Moreover, since the emitter-base junction is not exposed during the fabrication process thereof, the junction characteristic is improved. The epitaxy for forming the emitter and base layers is performed at one time, which also simplifies the fabrication process. Further, since the emitter electrode is of a size sufficient for connection, the base layer's thickness and emitter electrode's area can be easily controlled with regard to the operation speed of the device. The plane portion of the base layer on which the base electrode is formed does not interfere with the carrier migration from the emitter to the collector.

Furthermore, the emitter region having a width in submicrometers can be formed into an emitter electrode pattern having a width of several micrometers. This increases the margin in photolithography. In the present invention, the emitter electrode 57 is connected to the substrate in the form of a gentle slope, without producing a vertical height difference between them. This is one of the advantages over the conventional devices which have a large height difference between the substrate and the emitter electrode region. Accordingly, the present invention makes it easier to connect the semiconductor devices and to realize an emitter coupled logic (ECL). In addition, an insulating layer can be used as an epitaxy mask to isolate the semiconductor devices from each other, reducing the process time and steps required for performing the device isolation.

Therefore, it should be understood that the present invention is not limited to the particular embodiment disclosed herein as the best mode contemplated for carrying out the present invention, but rather that the present invention is not limited to the specific embodiment described in this specification except as defined in the appended claims.

What is claimed is:

1. A bipolar device comprising:
   an insulating layer formed on a substrate;
   a collector formed on the substrate and having an inclined portion;
   a base formed on the collector and having an inclined portion; and
   an emitter formed on the inclined portion of the base and having an inclined portion, wherein the collector has a thickness greater than a thickness of the insulating layer so that the inclined portion of the collector is formed over an edge portion of the insulating layer, and the base has a plane portion which is thicker than the inclined portion of the base.

2. The bipolar device, as claimed in claim 1, further comprising:
   an emitter electrode formed on the emitter and the insulating layer;
   a base electrode formed on the base; and
   a collector electrode formed on the collector.

3. The bipolar device as claimed in claim 2, wherein the emitter is formed on the inclined portion of the base and over an edge part of the a plane portion of the base.

4. The bipolar device as claimed in claim 1, wherein the insulating layer is an epitaxy mask for forming the collector, the base and the emitter using one of metal organic chemical vapor deposition (MOCBD), modular beam epitaxy (MBE), vapor phase epitaxy (VPE), and liquid phase epitaxy (LPE).

5. The bipolar device as claimed in claim 1, wherein the insulating layer is formed of a silicon oxide layer or silicon nitride layer.

6. The bipolar device as claimed in claim 1, wherein the substrate is formed of one of GaAs, InP, GaP and Si.

7. The bipolar device as claimed in claim 1, wherein the emitter is formed of n+ semiconductor, the base is formed of p+ semiconductor, and the collector is formed of n+ semiconductor.

8. The bipolar device as claimed in claim 1, wherein the emitter is formed of p+ semiconductor, the base is formed of n+ semiconductor, and the collector is formed of p+ semiconductor.

9. The bipolar device as claimed in claim 1, wherein the insulating layer is in the form of a strip and is formed at a slant angle with respect to the substrate.

10. The bipolar device as claimed in claim 9, wherein the slant angle ranges from 10° to 40°.

11. The bipolar device as claimed in claim 1, further comprising:
    an emitter electrode formed on the insulating layer and on the inclined portion of the emitter so that the emitter electrode has a plane portion and an inclined portion.

12. The bipolar device as claimed in claim 11, wherein the collector includes a subcollector layer and a collector layer, and the emitter includes an emitter layer and an emitter cap layer.

13. A bipolar device comprising:
    an insulating layer formed on a substrate;
    a collector formed on the substrate and having an inclined portion;
    a base formed on the collector and having an inclined portion; and
    an emitter formed on the inclined portion of the base and having an inclined portion,
    wherein the insulating layer is in the form of a strip and is formed at a slant angle with respect to the substrate.

14. The bipolar device as claimed in claim 13, wherein the slant angle ranges from 10° to 40°.

15. The bipolar device as claimed in claim 13, wherien the emitter is formed on the inclined portion of the base and over an edge part of a plane portion of the base.

16. The bipolar device as claimed in claim 13, further comprising:

an emitter electrode formed on the insulating layer and on the inclined portion of the emitter so that the emitter electrode has a plane portion and an inclined portion.

17. The bipolar device as claimed in claim 13, wherein the collector includes a subcollector layer and a collector layer, and the emitter includes an emitter layer and an emitter cap layer.

18. A bipolar device comprising:

an epitaxy mask formed on a substrate;

a collector formed on the substrate and directly on the epitaxy mask, the collector having an inclined portion;

a base formed on the collector and directly on the epitaxy mask, the base having an inclined portion; and an emitter formed on the base and having an inclined portion.

19. The bipolar device as claimed in claim 18, wherein the base is also formed directly on the collector.

20. The bipolar device as claimed in claim 18, wherein the emitter is formed directly on the epitaxy mask and the base.

21. The bipolar device as claimed in claim 18, further comprising:

an emitter electrode formed directly on the emitter and the epitaxy mask.

22. The bipolar device as claimed in claim 21, further comprising:

a base electrode formed on the base; and a collector electrode formed on the collector.

23. The bipolar device as claimed in claim 18, wherein the collector has a thickness greater than a thickness of the epitaxy mask.

24. The bipolar device as claimed in claim 18, wherein the inclined portion of the collector is formed over an edge portion of the epitaxy mask, and the base has a plane portion which is thicker than the inclined portion of the base.

25. The bipolar device as claimed in claim 18, wherein the epitaxy mask is formed at a slant angle with respect to the substrate.

26. The bipolar device as claimed in claim 25, wherein the slant angle ranges from 10° to 40°.

27. The bipolar device as claimed in claim 18, wherein the epitaxy mask is in the form of a strip.

* * * * *